United States Patent [19]
Bernstein et al.

[11] Patent Number: 6,091,273
[45] Date of Patent: *Jul. 18, 2000

[54] VOLTAGE LIMITING CIRCUIT FOR FUSE TECHNOLOGY

[75] Inventors: Kerry Bernstein, Underhill, Vt.; Daniel Charles Edelstein, New Rochelle, N.Y.; William Alan Klaasen, Underhill; Wilbur David Pricer, Charlotte, both of Vt.

[73] Assignee: International Business Machines Corporation, Armonk, N.Y.

[*] Notice: This patent issued on a continued prosecution application filed under 37 CFR 1.53(d), and is subject to the twenty year patent term provisions of 35 U.S.C. 154(a)(2).

[21] Appl. No.: 08/914,857

[22] Filed: Aug. 19, 1997

[51] Int. Cl.⁷ ...................................................... H03L 5/00
[52] U.S. Cl. ........................... 327/321; 327/525; 327/538; 323/315
[58] Field of Search .................................... 327/520, 525, 327/37, 309, 40, 41, 538, 545, 321, 546; 323/313, 312, 315; 361/103, 104, 111, 119, 10, 11, 13

[56] References Cited

U.S. PATENT DOCUMENTS

| | | | |
|---|---|---|---|
| 3,872,450 | 3/1975 | Reynolds | 365/96 |
| 4,104,546 | 8/1978 | Seiler | 327/77 |
| 4,716,547 | 12/1987 | Baskett et al. | 365/96 |
| 5,291,139 | 3/1994 | Fruhauf et al. | 324/550 |
| 5,291,434 | 3/1994 | Kowalski | 365/96 |
| 5,376,820 | 12/1994 | Crafts et al. | 257/529 |
| 5,404,049 | 4/1995 | Canada et al. | 327/525 |
| 5,418,487 | 5/1995 | Armstrong, II | 327/525 |
| 5,536,968 | 7/1996 | Crafts et al. | 257/529 |
| 5,675,280 | 10/1997 | Nomura et al. | 327/538 |
| 5,731,733 | 3/1998 | Denham | 327/525 |

*Primary Examiner*—Tuan T. Lam
*Assistant Examiner*—Minh Nguyen
*Attorney, Agent, or Firm*—Schmeiser, Olsen & Watts; Mark F. Chadurjian

[57] ABSTRACT

A voltage limiting circuit for fuse technology. The voltage limiting circuit is coupled to the two terminals. The voltage limiting circuit is responsive to a fuse blow through a low impedance sensing circuit, and then minimizes the voltage across the fuse gap that is created by the fuse blow. Thus, the invention prevents dendritic growth and corrosion in copper or similar types of fuses.

36 Claims, 9 Drawing Sheets

VOLTAGE LIMITING CIRCUIT FOR FUSE TECHNOLOGY

BACKGROUND OF THE INVENTION

1. Technical Field

The invention relates generally to integrated circuits, and more specifically, to circuits that incorporate fuse technology within integrated circuits.

2. Background Art

An important feature of integrated circuit designs is fuse technology. That is, a large number of integrated circuit designs now include fuses to implement certain features or to achieve desired results. For example, for many years dynamic random access memories (DRAMs) have included spare word lines and bit lines that can be substituted through fuse technology for faulty lines. On some integrated circuits, fuses are used to customize the chip function after manufacture. Fuses may also be used to trim precision components such as resistors or capacitors.

A fuse, has two possible states: the first state, when the fuse is intact; and the second or "blown" state, when the fuse is blown, or broken down. A fuse is typically blown through laser ablation or by forcing an excessive current through a narrow on-chip fuse wire. When either of these techniques are used, not only is the dielectric encapsulation, or protective covering around the fuse ruptured, which allows the metallic or similar material of the fuse to escape, but any other anti-corrosive material around the fuse is also ruptured.

Fuses are typically formed in the topmost layer of metal wires where they can be easily accessed for laser programming and from where the metallic material of the fuse can easily escape. In the past, the material used for fuses has been aluminum, which produces an oxide that is largely self passivating, thus preventing the fuse from "regrowing". Examples of this type of and similar types of fuses are found in the following U.S. patents: U.S. Pat. No. 5,291,139, "Circuit for Detection of the State of an Integrated Circuit Fuse in a Balanced Fuse Configuration", issued March 1994 to Fruhauf et al.; and U.S. Pat. No. 5,404,049, "Fuse Blow Circuit", issued April 1995 to Canada et al.

Future integrated circuits are progressing toward the use of other types of metals for wiring and fuses, such as copper, to allow for a smaller resistance in the circuit. Unfortunately, though, copper does not produce self-passivating oxides and thus is subject to dendritic growth, which can "regrow" a blown fuse; defeating the purpose of the fuse. Exposed copper is also subject to corrosion. Corrosion may enter the copper at the ruptured site and proceed to follow the wire to a junction where it will interrupt a device or circuit that is intended to remain conductive. Although the aforementioned patents disclose methods to detect the integrity of fuses, they do not disclose a method for preventing dendritic growth or corrosion in a blown fuse.

SUMMARY OF THE INVENTION

It is thus an advantage of the present invention to provide a circuit that will prevent dendritic growth in a blown fuse.

It is a further advantage of the present invention to provide a circuit that will prevent corrosion in a blown fuse.

Both dendritic growth and corrosion are stimulated by enhanced temperature, humidity and/or by the electric field (volts/micron). Generally, by controlling one of these factors, the growth and corrosion may also be controlled and contained. Hence, dendritic growth and corrosion may be arrested by reducing the voltage and consequently the electric field below appropriate thresholds.

Thus, the advantages of the invention are realized by a voltage limiting circuit for fuse technology. An integrated circuit comprises a fuse having two terminals and a voltage limiting circuit that is coupled to the terminals. The voltage limiting circuit is responsive to a fuse blow through a low impedance sensing circuit, and minimizes the voltage across a fuse gap that is created by the fuse blow.

The foregoing and other advantages and features of the invention will be apparent from the following more particular description of preferred embodiments of the invention, as illustrated in the accompanying drawings.

BRIEF DESCRIPTION OF THE DRAWINGS

The preferred exemplary embodiments of the present invention will hereinafter be described in conjunction with the appended drawings, where like designations denote like elements, and.

DETAILED DESCRIPTION OF THE DRAWINGS

Figure 1:
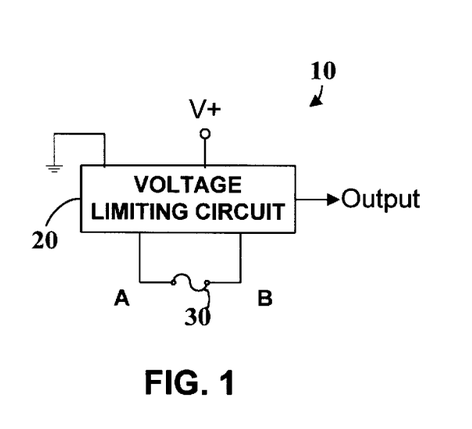
FIG. 1 is a block diagram of the fuse and voltage limiting circuit in accordance with the present invention.

Referring to FIG. 1, a block diagram of an integrated circuit 10 comprising a fuse 30 and voltage limiting circuit 20 in accordance with the present invention is disclosed. The voltage limiting circuit 20, coupled to the two terminals A-B of the fuse, is responsive to a fuse blow and minimizes the voltage across the fuse gap of terminals A-B created by the fuse blow. The voltage limiting circuit 20 also reduces the voltage across the fuse gap to at least approximately an order of magnitude lower than the power supply voltage V+ of the integrated circuit 10, the current being in the nano- to micro-amps range (as will be discussed in greater detail in reference to subsequent figures). The output of the voltage limiting circuit 20 outputs a signal that transitions at a designed voltage swing in response to the state of the fuse. As aforementioned, the reduced voltage produced by the voltage limiting circuit 20 inhibits the growth of dendrites in copper fuses and inhibits corrosion of the wire terminals.

Figure 2:
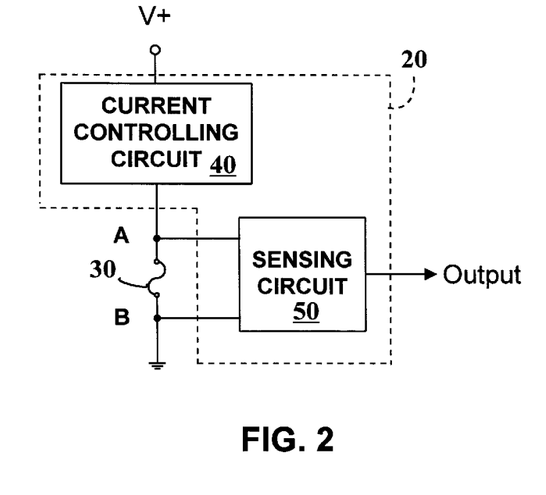
FIG. 2 is a block diagram of a first embodiment of the limiting circuit of FIG. 1.

FIG. 2 illustrates a block diagram of a first embodiment of present invention, which will be further realized by the exemplary circuit diagrams of FIGS. 3 and 14–23 below. In FIG. 2, the voltage limiting circuit 20 comprises current controlling circuit 40 and a low impedance sensing circuit 50. As will be seen in subsequent drawings, current controlling circuit 40 may comprise a current source (FIG. 3), a high valued resistor (FIG. 16) or similar devices. Current controlling circuit 40 and sensing circuit 50 may also overlap in some areas, as will be seen in subsequent examples, even though this is not explicitly shown in FIG. 2. Current controlling circuit 40 provides a small value of current, typically in the microamps or nanoamps range, to the fuse. An unblown fuse will then appear as a short circuit to current controlling circuit 40, thus producing a voltage approximately 0 Volts across the unblown fuse. Sensing circuit 50 is connected across fuse 30. The impedance of sensing circuit 50 is no larger than is needed to reliably sense the state of the fuse. When fuse 30 is blown, the voltage across the fuse gap will be limited to typically a few hundreds of millivolts (mV) rather than the few volts of the power supply. Sensing circuit 50 provides a full binary logic output signal.

Figure 3:
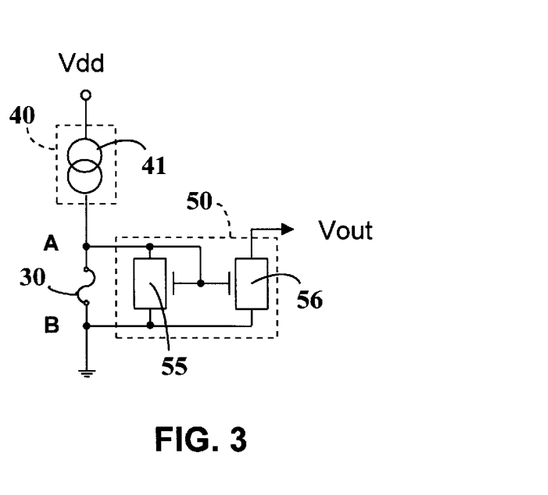
FIG. 3 is an exemplary schematic diagram of the limiting circuit of FIG. 2.

FIG. 3 further illustrates the basic operation of the voltage limiting circuit 20 of FIGS. 1 and 2. In FIG. 3, current controlling circuit 40 comprises current source 41, which is connected to terminal A of fuse 30. Terminal B of fuse 30 in this example is grounded. Sensing circuit 50 comprises field-effect transistor (FET) 55 and FET 56. FET 55, which is coupled via its source and drain across fuse 30, provides low impedance sensing for sensing circuit 50. The drain of FET 55 is coupled to the gates of FET 55 and FET 56, the source of FET 56 is coupled to the source of FET 55, and the drain of FET 56 is coupled to the output Vout. FET 55 and 56 form a current mirror circuit, wherein FET 56 provides a matching current drive signal at its drain that corresponds to the state of fuse 30. Thus, in this example, the voltage across a blown fuse is limited to one FET threshold or less and Vout will be approximately equal to zero volts.

Figure 4:
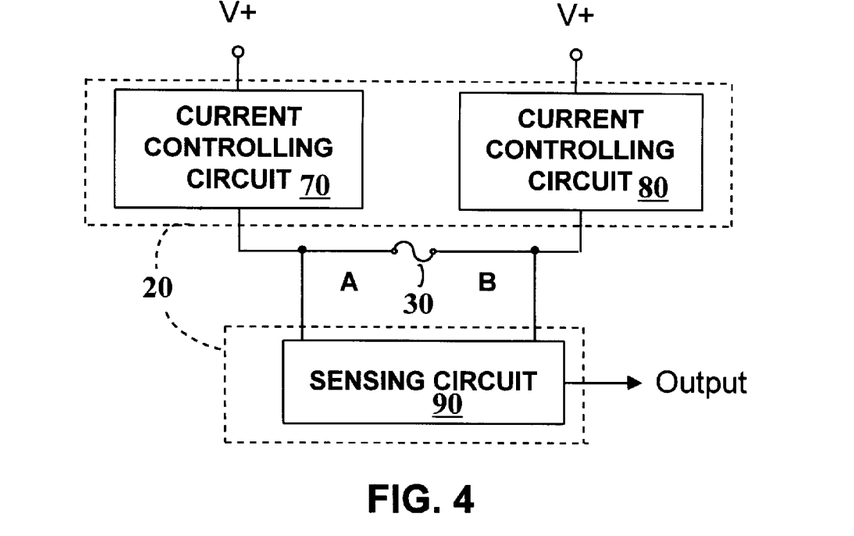
FIG. 4 is a block diagram of a preferred embodiment of the limiting circuit of FIG. 1.

FIG. 4 illustrates a block diagram of the preferred embodiment of the present invention. In this embodiment, two current controlling circuits 70 and 80 are used, one being connected to terminal A of fuse 30 and the other being connected to terminal B of fuse 30. As with the first embodiment of the present invention, current controlling circuits 70 and 80 may comprise a current source, a high valued resistor or similar devices. Sensing circuit 90 is coupled across fuse 30. The basic operation of FIG. 4 is similar to that of FIGS. 1 and 2, whereas the sensing circuit detects the state of the fuse and will minimize the voltage across the fuse gap when the fuse is blown. The output will either indicate the fuse is intact (Output≈0 Volts) or transition to approximately V+ when the fuse is blown. Thus, the sensing circuit 90 provides a full binary logic output signal. As will be discussed below in reference to FIGS. 5–9, though, this embodiment of the invention allows for an even lower voltage across the blown fuse than the embodiment of FIG. 2, approximately 20–40 mV as compared to 200–400 mV.

Figure 5:
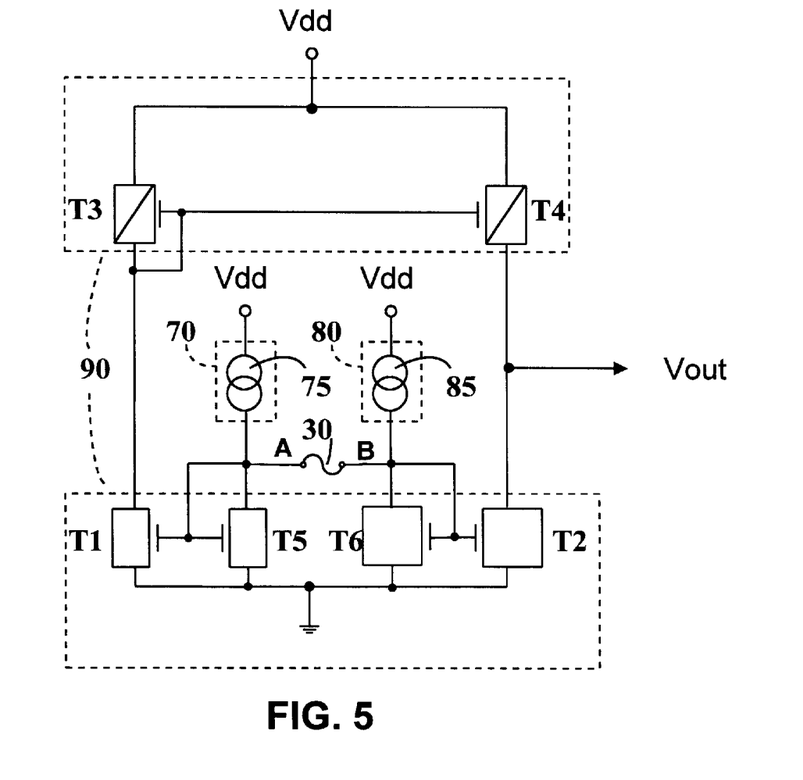
FIG. 5 is the preferred schematic diagram for the limiting circuit of FIG. 4.

FIG. 5 illustrates the preferred schematic diagram of FIG. 4. In this example, current controlling circuits 70 and 80 comprise currents sources 75 and 85, respectively. Sensing circuit 90 comprises two low impedance input current mirror circuits T5 with T1 and T6 with T2 of a first conductivity, and current mirror T3 with T4 of a second conductivity. The sources of T1, T2, T5 and T6 are commonly tied to a first source of potential (i.e., ground). The gates of T1 and T5 and the drain of T5 are coupled to first current source 75 and terminal A of fuse 30. The gates of T2 and T6 and the drain of T6 are coupled to second current source 85 and terminal B of fuse 30. The drain of T1 is coupled to the drain and gate of T3, and the drain of T2 is coupled to the drain of T4. The gates of T3 and T4 are tied together and to the drain of T3. The sources of T3 and T4 are coupled to a second source of potential (i.e., Vdd). Vout is coupled to the drains of T2 and T4.

In operation, the circuit is provided with imbalance to function properly. That is, the current sources may be unbalanced and/or the input impedances may be unbalanced. In the preferred embodiment, both the current sources 75 and 85 and the input impedances T5 and T6 of the current mirrors are unbalanced. That is, the first current source 75 is of a different magnitude of the second current source 85, and T6 is of a different W/L ratio, (channel width) than T5. For purposes of illustration the current sources will be shown in FIGS. 6 and 8 to differ by a factor of two, and the input transistors sizes are shown to differ by a factor of two. This is for illustration purposes only, since the preferred embodiment will function properly with far smaller imbalances. The current sources and biases are chosen such that the current mirror devices are biased near threshold. The circuit of FIG. 5 operates equally well in the above threshold and sub-threshold regions.

Figure 6:
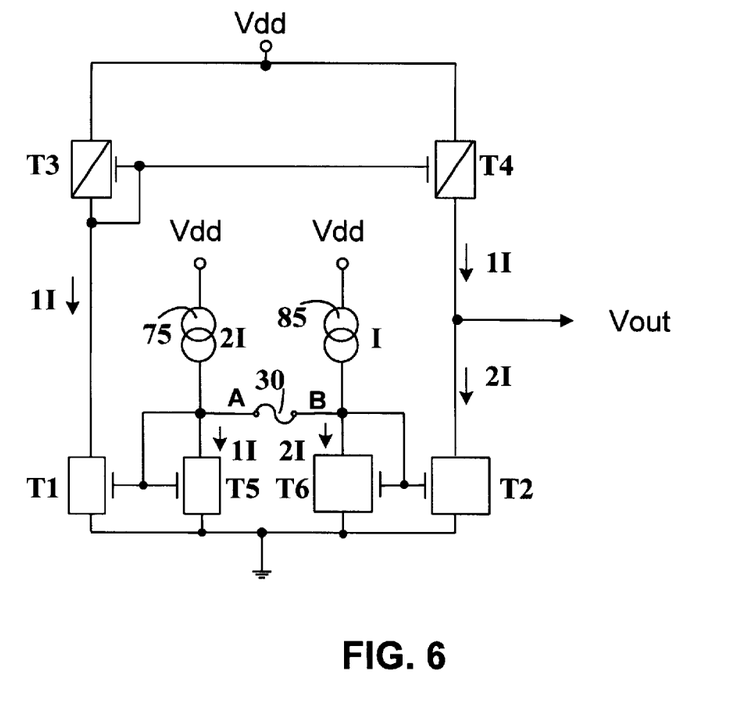
FIGS. 6, 7, 8 and 9 illustrate the current/voltage operations of FIG. 5.
Figure 7:
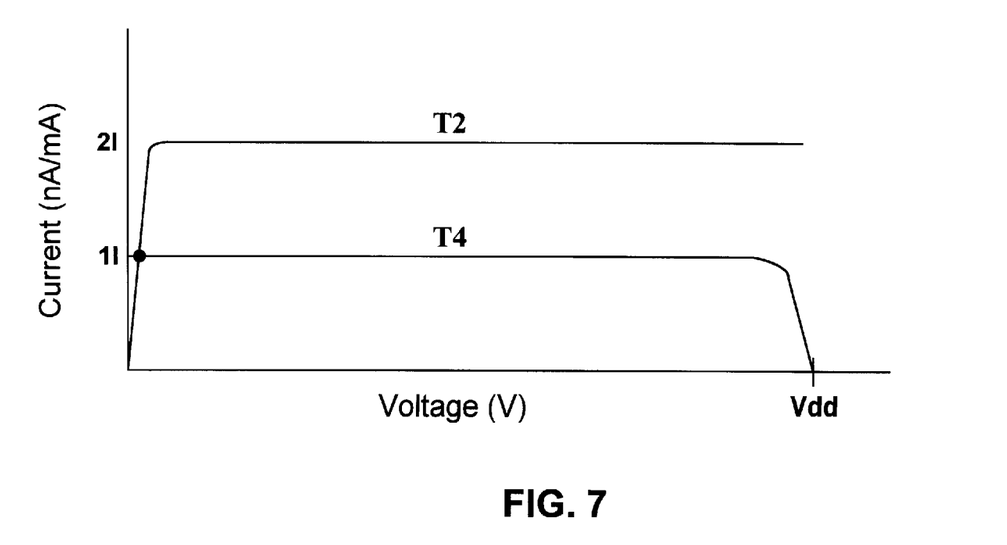

Relative currents that flow in the circuit of FIG. 5 while the circuit is sensing the state of an intact or unblown fuse are shown in FIG. 6. When the fuse is intact, each input impedance circuit sinks its designed value of current. T3 and T4 detect how the currents divide between current mirrors T1 with T5 and T2 with T6, and in this case, provide 1I to T2. Since T2 is being biased to sink 2I rather than the 1I being supplied by T4, T2 is operating in the linear region and the output voltage is near ground potential. This can be seen in FIG. 7, wherein the load lines of the circuit of FIG. 6 are shown with respect to T2 and T4. The relative currents flowing through T4 and T2 will remain unbalanced only until the final voltage of Vout equaling approximately zero volts is reached. Thereafter a current of approximately 1I will flow through T4 and T2.

Figure 8:
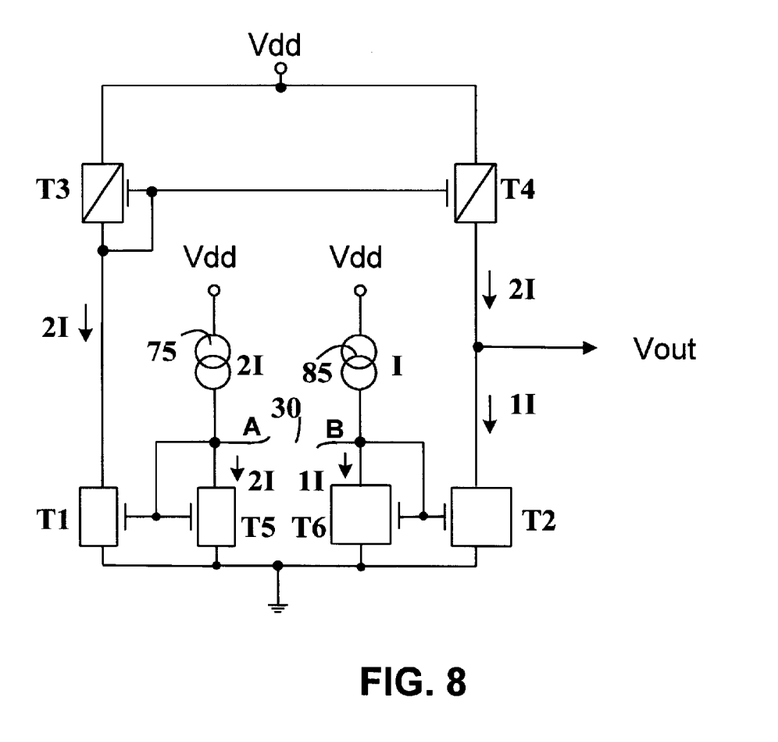
Figure 9:
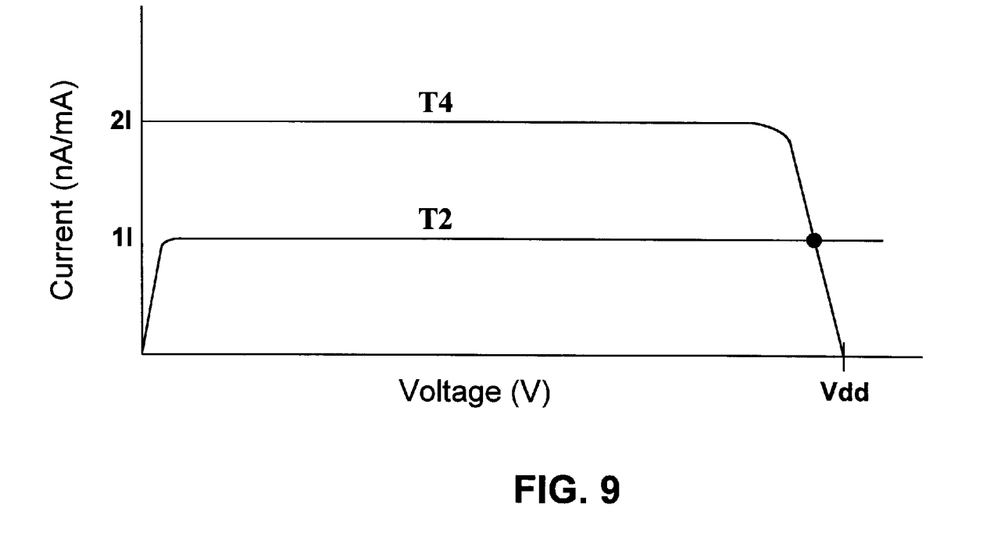

Relative currents that flow in the circuit of FIG. 5 while the circuit is sensing the state of a blown fuse are shown in FIG. 8. When the fuse is blown, equal currents of 2I are forced through T5 and T1 (the smaller current mirror), while equal currents of only 1I is provided to T6 and T2. The potential at node A will rise slightly and the potential at node B will fall slightly. Thus, the potential across the now opened fuse gap will be small (less than 100 mV). T1 will provide 2I to T3, which sets up the bias for T4. Since T2 is biased to conduct 1I, the output potential rises toward Vdd to force T4 into the linear region and limit the current through T4 and T2 to 1I. Thus, the relative currents flowing through T4 and T2 will remain unbalanced only until the final voltage of Vout equaling approximately Vdd volts is reached. Thereafter a current of approximately 1I will flow through T4 and T2. The load lines of the circuit of FIG. 8 are shown with respect to T2 and T4 in FIG. 9.

Figure 10:
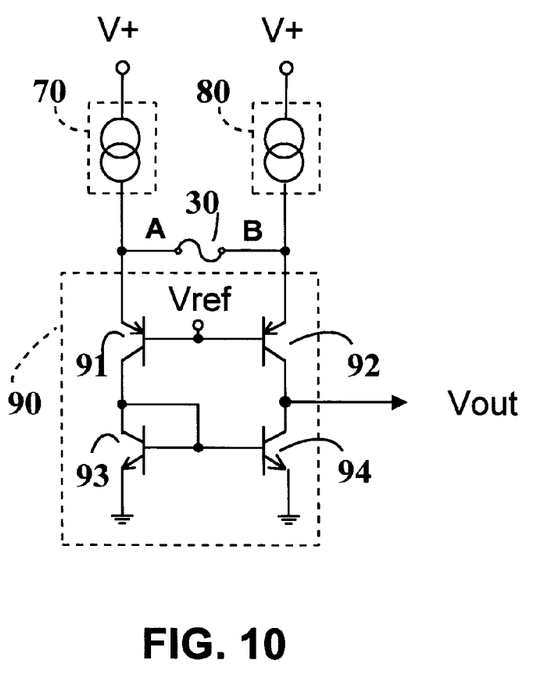
FIGS. 10, 11, 12, and 13 are additional exemplary schematic diagrams for the limiting circuit of FIG. 4.

FIG. 10 illustrates the bipolar embodiment of the circuit of FIG. 5. The sensing circuit 90 comprises two pnp transistors 91 and 92 and two npn transistors 93 and 94. Terminal A of fuse 30 is coupled to the emitter of transistor 91. The collector of transistor 91 is coupled to the collector and base of transistor 93 and the base of transistor 94. The base of transistor 91 is coupled to a reference voltage Vref and to the base of transistor 92. The emitter of transistor 92 is coupled to terminal B of fuse 30. The collector of transistor 92 is coupled to Vout and the collector of transistor 94. The emitters of transistors 93 and 94 are commonly tied to ground. In operation, the emitters of transistors 91 and 92 act as diodes to Vref, thus producing the minimized voltage across the fuse gap when the fuse is blown.

Figure 11:
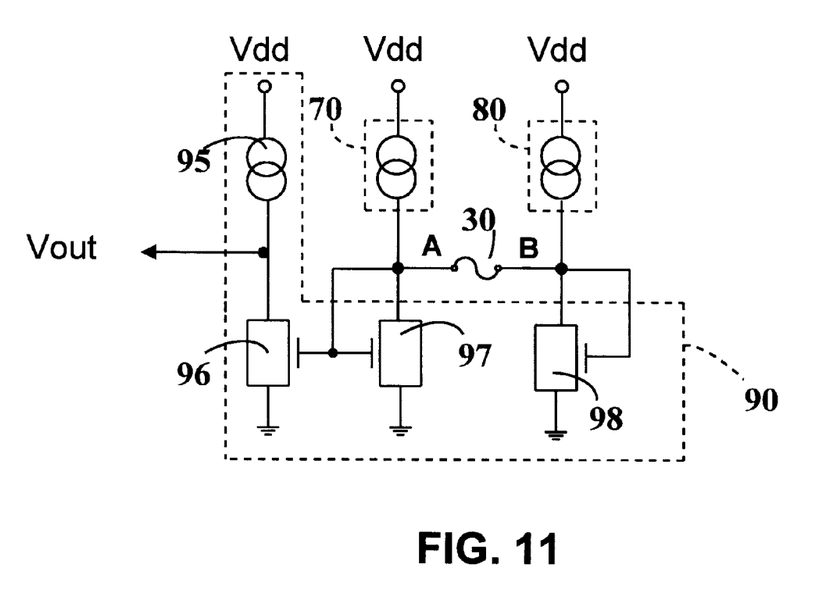
Figure 12:
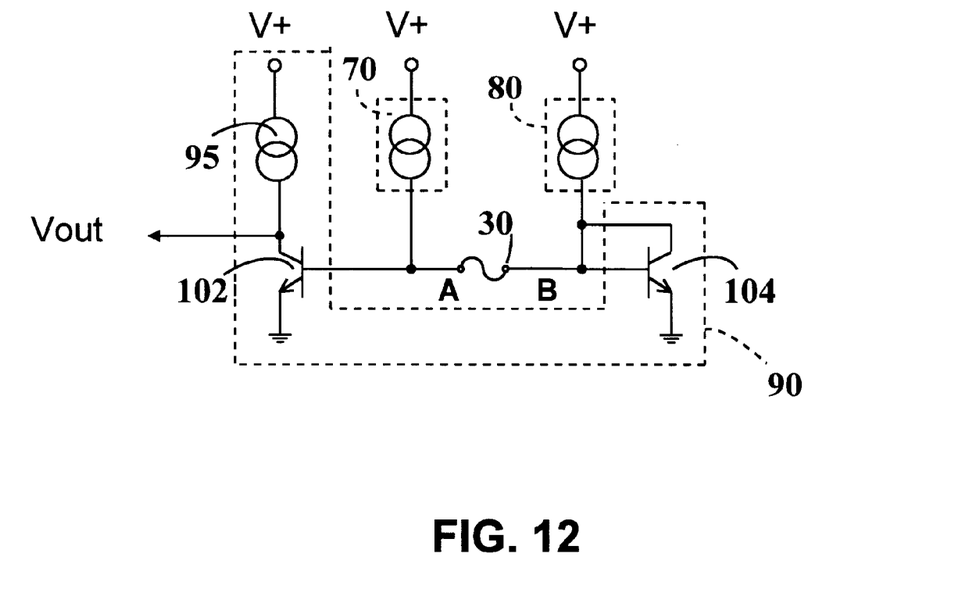
Figure 13:
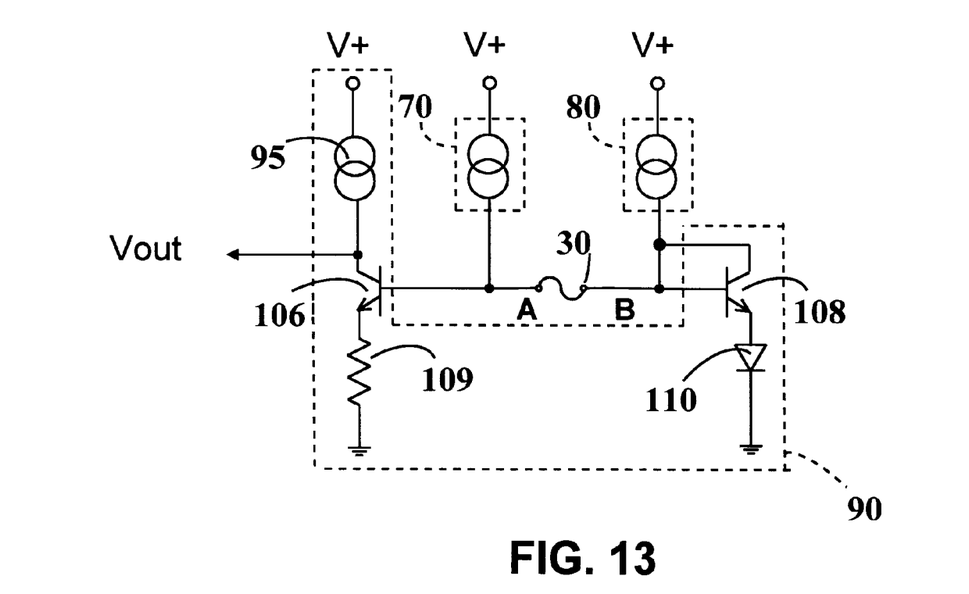

FIGS. 11–13 depict three other exemplary schematics for the block diagram of FIG. 4. The operations being similar thereto. Although current sources are used in these examples, high valued resistors may also be used. As seen in FIG. 11, terminal A of fuse 30 is coupled to the drain of FET 97 and to the gates of FETs 97 and 96. The drain of FET 96 is coupled to Vout and current source 95. Terminal B of fuse 30 is coupled to the drain and gate of FET 98. The sources of FETs 96, 97 and 98 are commonly tied to ground. As seen in FIG. 12, terminal A is coupled to the base of transistor 102. The collector of transistor 102 is coupled to Vout and current source 95. Terminal B of fuse 30 is coupled to the base and collector of transistor 104. The emitters of transistors 102 and 104 are tied to ground. As seen in FIG. 13, terminal A of fuse 30 is coupled to the base of transistor 106. The collector of transistor 106 is coupled to Vout and current source 95. The emitter of transistor 106 is coupled to resistor 109, which in turn is tied to ground. Terminal B of fuse 30 is coupled to the base and collector of transistor 108. The emitter of transistor 108 is coupled to diode 110, which is tied to ground. In all three examples, a first current controlling circuit 70 is coupled to terminal A of fuse 30 and a second current controlling circuit 80 is coupled to terminal B of fuse 30.

Figure 14:
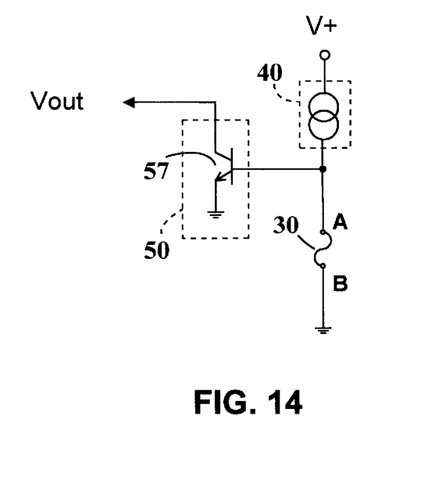
FIGS. 14, 15, 16, 17, 18, 19, 20, 21, 22, and 23 are additional exemplary schematic diagrams for the limiting circuit of FIG. 2.
Figure 15:
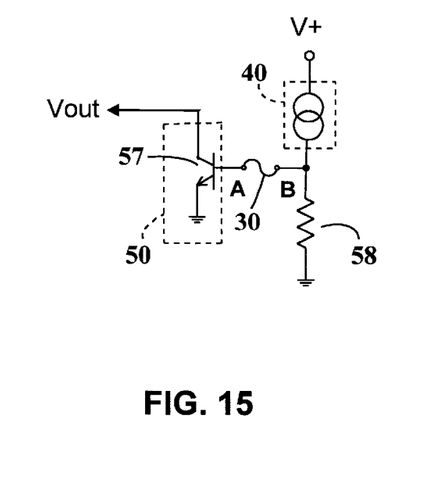
Figure 16:
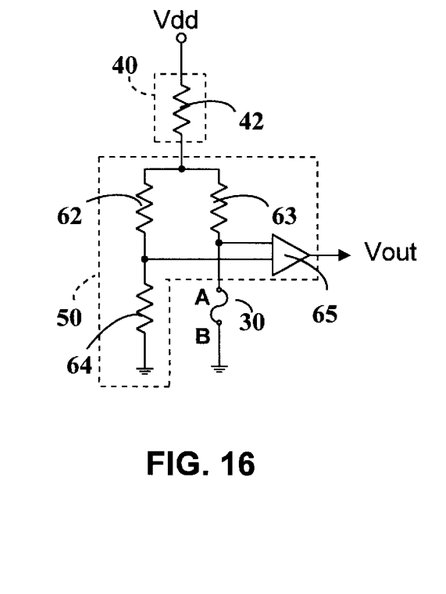
Figure 17:
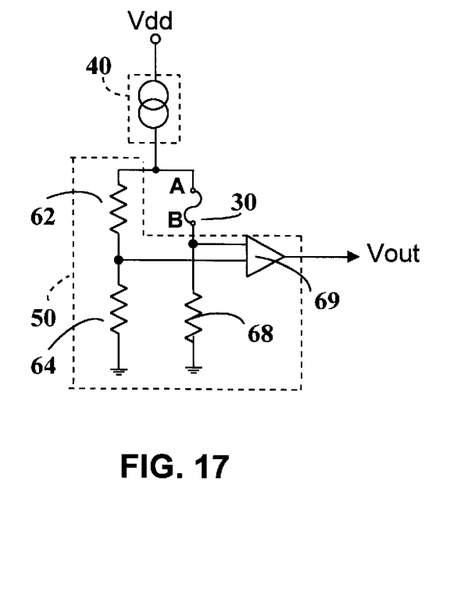

FIGS. 14–23 depict ten other exemplary schematics for the block diagram of FIG. 2. The operations being similar to the ones described above in reference to FIGS. 2 and 3. As aforementioned a current source may be interchangeable with a high valued resistor and vice versa in any of these examples without changing the operability of the invention. In FIGS. 14–23, terminal A of fuse 30 is coupled to current controlling circuit 40 and terminal B of fuse 30 is tied to ground unless otherwise noted. As seen in FIG. 14, terminal A of fuse 30 is coupled to the base of transistor 57. The collector of transistor 57 is coupled to Vout and the emitter of transistor 57 is tied to ground. FIG. 15 shows terminal B of fuse 30 being coupled to current controlling circuit 40 and resistor 58, which in turn is tied to ground. Terminal A of fuse 30 is coupled to the base of transistor 57. The collector of transistor 57 is coupled to Vout and the emitter of transistor 57 is tied to ground. In FIG. 16, terminal A of fuse 30 is coupled to resistor 63 and to an input of operational amplifier (op amp) 65, which in turn outputs to Vout. The other input of op amp 65 is coupled to resistor 62 and resistor 64, which is tied to ground. In this example, the current controlling circuit 40 comprises a high valued resistor 42, even though a current source may also be used. Resistor 62 is coupled to resistor 42 and resistor 63. FIG. 17 is similar to FIG. 16 except that transistor 63 and fuse 30 (of FIG. 16) have been interchanged. The current controlling circuit 40 of FIG. 17 comprises a current source.

Figure 18:
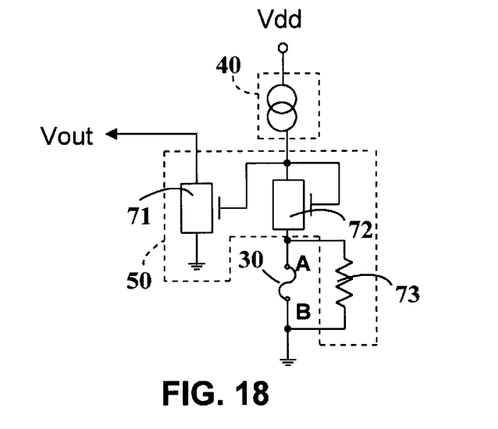
Figure 19:
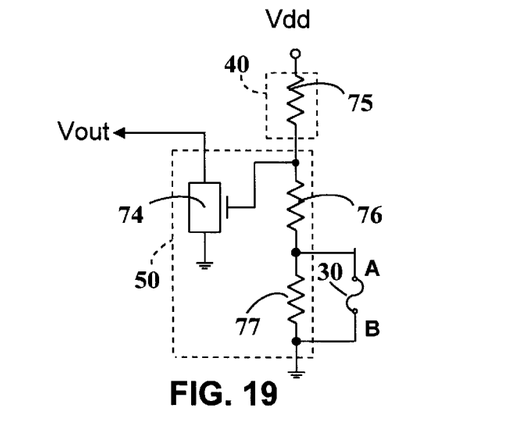
Figure 20:
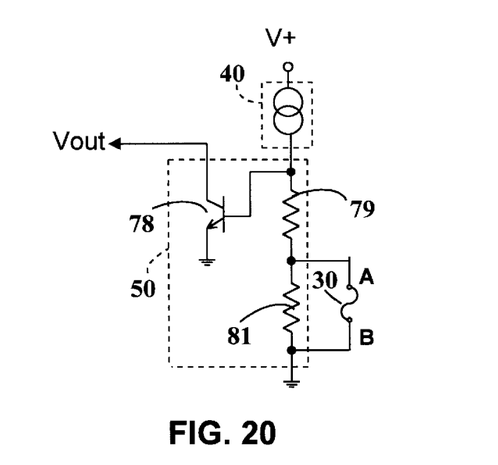

As seen in FIG. 18, terminal A of fuse 30 is coupled to the source of FET 72 and to resistor 73, which is coupled to terminal B of fuse 30. The gate of FET 72 is coupled to its drain, to the gate of FET 71 and to current controlling circuit 40. The drain of FET 71 is coupled to Vout and the source is tied to ground. FIG. 19 is similar to FIG. 18 except FET 72 of FIG. 18 has been replaced with resistor 76 of FIG. 19. FIG. 20 is similar to FIG. 19 except FET 74 has been replaced with transistor 78, whereas the base of transistor 78 is coupled to resistor 79 and current controlling circuit 40; the collector is coupled to Vout; and the emitter is tied to ground.

Figure 21:
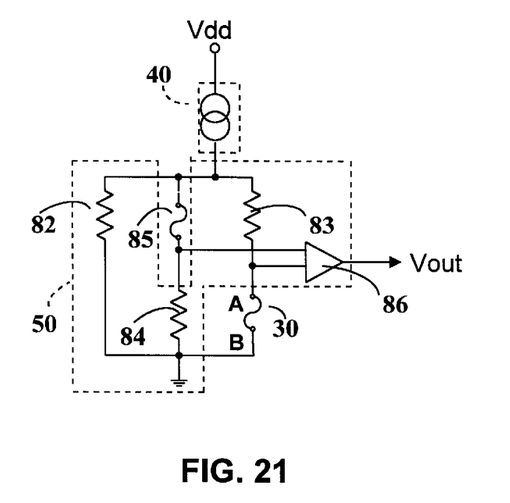
Figure 22:
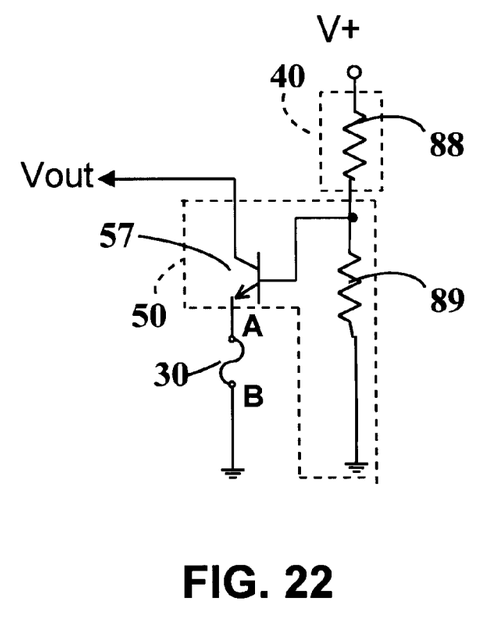
Figure 23:
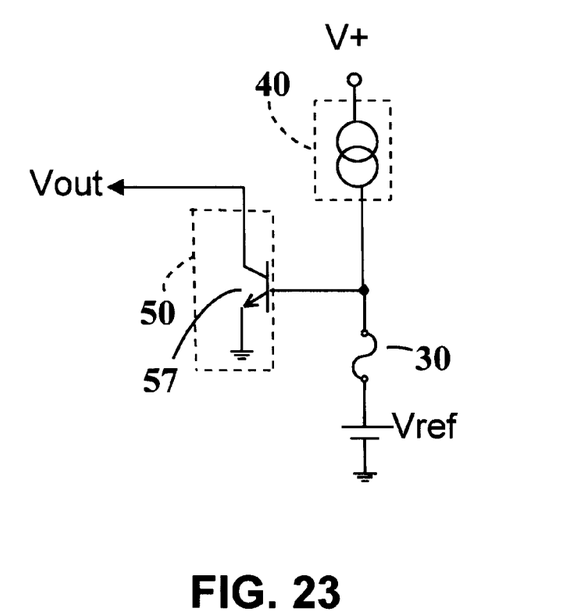

As seen in FIG. 21, two fuses 30 and 85 are used. Terminal A of fuse 30 is coupled to resistor 83 and to a first input of op amp 86, which in turn outputs Vout. Resistor 83 is coupled to current controlling circuit 40, resistor 82, and fuse 85. Fuse 85 is coupled to a second input of op amp 86 and to resistor 84. Resistors 82 and 84 are tied to ground. As seen in FIG. 22, terminal A of fuse 30 is coupled to the emitter of transistor 87. The base of transistor 87 is tied to current controlling circuit 40 and resistor 89, which in turn is tied to ground. The collector of transistor 87 is coupled to Vout. FIG. 23 is similar to FIG. 14 except there is a reference voltage (Vref) between fuse 30 and ground.

Thus, this invention provides several examples of a voltage limiting circuit that prevents dendritic growth and corrosion in copper and similar types of fuses with the propensity to reconnect, by limiting the voltage around a blown fuse, thus increasing efficiency and integrity of a circuit using copper fuses.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. An apparatus comprising:
   a fuse having two terminals;
   a voltage limiting circuit coupled to said terminals;
   said voltage limiting circuit responsive to a fuse blow and minimizing a voltage across a fuse gap created by the fuse blow; and
   said voltage limiting circuit further comprises:
   a current controlling circuit directly coupled to the fuse; and
   a sensing circuit coupled to the current controlling circuit, wherein said sensing circuit comprises at least one current mirror for sensing the fuse blow, and wherein the sensing circuit is directly coupled to the fuse.

2. The apparatus of claim 1, wherein the fuse gap is defined by the terminals and wherein the voltage limiting circuit reduces the voltage drop across the fuse gap such that the voltage drop across the fuse gap does not enhance corrosion of the terminals.

3. The apparatus of claim 1, wherein the voltage limiting circuit reduces the voltage across the fuse gap such that the voltage across the fuse gap does not enhance dendritic growth across the fuse gap.

4. The apparatus of claim 1, wherein the apparatus operates under a designed voltage swing, and wherein the voltage limiting circuit includes an output for outputting a signal that transitions at the designed voltage swing in response to the fuse blow.

5. The apparatus of claim 1, wherein said current controlling circuit is at least one current source.

6. The apparatus of claim 1, wherein said current controlling circuit comprises at least one resistor.

7. The apparatus of claim 1, wherein said sensing circuit provides a full binary logic output signal.

8. The apparatus of claim 1, wherein said current controlling circuit further comprises:
   a first current source, coupled between a source of potential and a first terminal of said fuse; and
   a second current source, coupled between a source of potential and a second terminal of said fuse.

9. The apparatus of claim 8, wherein said first current source is of a different magnitude than said second current source.

10. The apparatus of claim 1, wherein said current controlling circuit provides current within a range of nanoamps to microamps.

11. The apparatus of claim 1, wherein said apparatus is an integrated circuit.

12. The apparatus of claim 1, wherein the voltage limiting circuit reduces the voltage across the fuse gap to less than approximately 400 millivolts.

13. A method of preventing corrosion and dendritic growth across a fuse gap comprising the steps of:
   sensing a fuse blow of a fuse;
   minimizing a voltage across the fuse gap created by the fuse blow, said minimizing comprising providing a current controlling circuit directly coupled to the fuse; and
   providing at least one current mirror for sensing the fuse blow, wherein the at least one current mirror is within a sensing circuit, and wherein the sensing circuit is directly coupled to the fuse.

14. The method of claim 13, further comprising the step of: outputting a signal that transitions at a designed voltage swing in response to the fuse blow.

15. The method of claim 13, wherein said current controlling circuit provides current within a range of nanoamps to microamps.

16. The method of claim 13, further comprising the step of: providing at least one current source for said current controlling circuit.

17. The method of claim 13, further comprising the step of:
   providing at least one resistor for said current controlling circuit.

18. The method of claim 13, further comprises the step of: reducing the voltage across the fuse gap to less than approximately 400 millivolts.

19. An apparatus comprising:
   a fuse having two terminals;
   a voltage limiting, circuit coupled to said terminals;
   said voltage limiting circuit responsive to a fuse blow and minimizing a voltage across a fuse gap created by the fuse blow; and
   said voltage limiting circuit further comprising:
      (a) a current controlling circuit coupled to the fuse, wherein said current controlling circuit comprises:
         a first current source, coupled between a source of potential and a first terminal of said fuse; and
         a second current source, coupled between a source of potential and a second terminal of said fuse; and
      (b) a sensing circuit coupled to the current controlling circuit and the fuse, wherein said sensing circuit comprises:
         at least one low-impedance current-mirror input for sensing the fuse blow;
         a first FET of a first conductivity type having a drain and a gate coupled to said first terminal of said fuse and a source coupled to a first source of potential;
         a second FET of said first conductivity type having a drain and gate coupled to said second terminal of said fuse and a source coupled to said first source of potential;
         a third FET of said first conductivity type having a gate coupled to said gate of said first FET and a source coupled to said first source of potential;
         a fourth FET of said first conductivity type having a gate coupled to said gate of said second FET and a source coupled to said first source of potential;
         a fifth FET of a second conductivity type having a drain and gate coupled to the drain of said third FET and a source coupled to a second source of potential;
         a sixth FET of said second conductivity type having a gate coupled to said fifth FET and a drain coupled to a drain of said fourth FET and a source coupled to said second source of potential; and
         an output coupled to said drain of said fourth FET and said drain of said sixth FET.

20. The apparatus of claim 19, wherein said second FET is of a different channel width than said first FET.

21. An apparatus comprising:
   a fuse having two terminals;
   a voltage limiting circuit coupled to said terminals;
   said voltage limiting circuit responsive to a fuse blow and minimizing a voltage across a fuse gap created by the fuse blow, wherein the voltage limiting circuit reduces the voltage across the fuse gap to at least an order of magnitude lower than a power supply voltage of the apparatus; and
   said voltage limiting circuit further comprises:
   a current controlling circuit directly coupled to the fuse; and
   a sensing circuit coupled to the current controlling circuit and the fuse, wherein said sensing circuit comprises at least one current mirror for sensing the fuse blow, and wherein the sensing circuit is directly coupled to the fuse.

22. The apparatus of claim 21, wherein the fuse gap is defined by the terminals and wherein the voltage limiting circuit reduces the voltage across the fuse gap such that the voltage across the fuse gap does not enhance corrosion of the terminals.

23. The apparatus of claim 21, wherein the voltage limiting circuit reduces the voltage across the fuse gap such that the voltage across the fuse gap does not enhance dendritic growth across the fuse gap.

24. The apparatus of claim 21 wherein the apparatus operates under a designed voltage swing, and wherein the voltage limiting circuit includes an output for outputting a signal that transitions at the designed voltage swing in response to the fuse blow.

25. The apparatus of claim 21, wherein said current controlling circuit is at least one current source.

26. The apparatus of claim 21, wherein said current controlling circuit comprises at least one resistor.

27. The apparatus of claim 21, wherein said sensing circuit provides a full binary logic output signal.

28. The apparatus of claim 21, wherein said current controlling circuit further comprises:
   a first current source, coupled between a source of potential and a first terminal of said fuse; and
   a second current source, coupled between a source of potential and a second terminal of said fuse.

29. The apparatus of claim 21, wherein said first current source is of a different magnitude than said second current source.

30. The apparatus of claim 21, wherein said current controlling circuit provides current within a range of nanoamps to microamps.

31. The apparatus of claim 21, wherein said apparatus is an integrated circuit.

32. A method of preventing corrosion and dendritic growth across a fuse gap comprising the steps of:
   sensing a blow of a fuse;
   minimizing a voltage across the fuse gap created by the fuse blow, wherein the voltage across the fuse gap is reduced to at least an order of magnitude lower than a power supply voltage, said minimizing comprising providing a current controlling circuit directly coupled to the fuse; and
   providing at least one current mirror for sensing the fuse blow, wherein the at least one current mirror is within a sensing circuit, and wherein the sensing circuit is directly coupled to the fuse.

33. The method of claim 32, further comprising the step of: outputting a signal that transitions at a designed voltage swing in response to the fuse blow.

34. The method of claim 32, wherein said current controlling circuit provides current within a range of nanoamps to microamps.

35. The method of claim 32, further comprising the step of: providing at least one current source for said current controlling circuit.

36. The method of claim 32, further comprising the step of:

provingd at least one resistor for said current controlling circuit.

\* \* \* \* \*